(12) United States Patent
Foong et al.

(10) Patent No.: US 9,140,721 B2
(45) Date of Patent: Sep. 22, 2015

(54) ELECTRICAL INTERCONNECT ASSEMBLY

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 14/609,076

(22) Filed: Jan. 29, 2015

(65) Prior Publication Data

US 2015/0212111 A1    Jul. 30, 2015

Related U.S. Application Data

(63) Continuation of application No. 14/122,219, filed as application No. PCT/MY2011/000058 on May 27, 2011, now Pat. No. 8,952,714.

(51) Int. Cl.
*G01R 1/04* (2006.01)
*H01R 13/24* (2006.01)

(52) U.S. Cl.
CPC ............ *G01R 1/0466* (2013.01); *G01R 1/0483* (2013.01); *H01R 13/2407* (2013.01)

(58) Field of Classification Search
CPC ........... G01R 1/06716; G01R 1/07378; G01R 1/0483; G01R 1/0491; G01R 31/2831; G01R 1/0466; H05K 7/1023; H05K 1/141
See application file for complete search history.

(56) References Cited

U.S. PATENT DOCUMENTS

| | | | | |
|---|---|---|---|---|
| 4,969,828 A | * | 11/1990 | Bright et al. ..................... | 439/68 |
| 5,816,828 A | * | 10/1998 | Ikeya et al. ..................... | 439/73 |
| 6,152,744 A | * | 11/2000 | Maeda ............................ | 439/71 |
| 2007/0272924 A1 | | 11/2007 | Yung-Sing | |
| 2008/0054924 A1 | | 3/2008 | Foong | |
| 2009/0267629 A1 | | 10/2009 | Foong | |

FOREIGN PATENT DOCUMENTS

EP    1 753 100 A1    2/2007
EP    1 826 575 A2    8/2007

OTHER PUBLICATIONS

International Search Report and Written Opinion dated Feb. 3, 2013 in application No. PCT/MY2011/000058.
International Preliminary Report on Patentability Sep. 2, 2013 in application No. PCT/MY2011/000058.

* cited by examiner

*Primary Examiner* — Tung X Nguyen
(74) *Attorney, Agent, or Firm* — Maschoff Brennan

(57) ABSTRACT

An electrical test contact electrically connects a test terminal of an Integrated Circuit (IC) test assembly with an IC terminal of an IC device in an electrical interconnect assembly. The test contact is formed of electrically conductive material and includes a head portion and a foot portion. The head portion includes a first electrical contacting portion for electrically engaging an IC terminal of an IC device during use, and the foot portion includes a second electrical contacting portion for electrically engaging a test terminal of a test assembly during use. The head portion includes a head receiving portion that receives a first resiliently biasing member to retain the first resiliently biasing member in contact with the test contact. The first resiliently biasing member biases the first electrical contacting portion against the IC terminal of the IC device during use. An electrical interconnect assembly having multiple test contacts is also disclosed.

10 Claims, 4 Drawing Sheets

ELECTRICAL INTERCONNECT ASSEMBLY

CROSS-REFERENCE TO RELATED APPLICATIONS

This application is a continuation of U.S. patent application Ser. No. 14/122,219, filed Nov. 25, 2013, now U.S. Pat. No. 8,952,714 which is the national stage of International Application No. PCT/MY2011/000058, filed on May 27, 2011. The foregoing applications are incorporated herein by reference.

FIELD OF THE INVENTION

The present invention relates to an electrical interconnect assembly for use in testing integrated circuit (IC) devices and to a test contact for use in an electrical interconnect assembly.

BACKGROUND OF THE INVENTION

As part of an IC manufacturing process, it is important to test manufactured IC devices in order to ensure that the devices are operating correctly and to required specifications. Such testing is generally carried out using an IC test system, the test system having a test assembly and an interconnect assembly arranged to electrically connect the test assembly with pads/leads of an IC during testing so that characteristics of the IC device in response to input electrical stimuli can be determined and compared with reference responses by the test assembly. The interconnect assembly comprises a series of test contacts which extend between respective test terminals of the test assembly and IC terminals of the IC device. The test assembly is arranged to provide an interface between a test assembly and an IC device whilst minimizing the likelihood of damage to leads/pads of the IC device.

In one arrangement, the interconnect assembly includes first and second arm portions arranged to respectively connect with test terminals and IC terminals. The test contacts are moveably disposed in the interconnect assembly and resiliently biased such that during use, when an IC device is engaged with the test assembly, a biasing force is exerted so as to urge the first arm portion into good electrical contact with an IC terminal of an IC device and so as to urge the second arm portion into good electrical contact with a test terminal of the test assembly. The test contacts in this arrangement, however, can transfer excessive force to the test terminal resulting in premature wear of the test terminal and can damage the IC terminal during use.

SUMMARY OF THE INVENTION

In accordance with a first aspect of the present invention, there is provided an electrical test contact for electrically connecting a test terminal of an IC test assembly with an IC terminal of an IC device in an electrical interconnect assembly, the test contact being formed of electrically conductive material and comprising:
a head portion; and
a foot portion;
the head portion comprising a first electrical contacting portion for electrically engaging an IC terminal of an IC device during use, and the foot portion comprising a second electrical contacting portion for electrically engaging a test terminal of a test assembly during use, the first and second electrical contacting portions being substantially oppositely located on the test contact; wherein
the head portion comprises a head receiving portion arranged to receive a first resiliently biasing member to thereby retain the first resiliently biasing member in contact with the test contact; and wherein
the first resiliently biasing member is arranged to bias the first electrical contacting portion against the IC terminal of the IC device during use.

In one embodiment, the head receiving portion restricts the test contact from moving laterally relative to a vertical plane intersecting the test terminal. In another embodiment, the head receiving portion restricts the test contact from moving vertically relative to the vertical plane intersecting the test terminal. That is, the retention of the first resiliently biasing member reduces vibration and enhances stability, rigidity and co-planarity of the test contact, in particular, during use.

In one embodiment, the first resiliently biasing member (e.g. top elastomer) is located vertically under the first electrical contacting portion (e.g. direct contact area) to absorb the force exerted on the test contact (e.g. test pin) during use. The top elastomer may also be pre-tensioned and is held in place by the head receiving portion of the test pin so that during use the pin only moves vertically downward relative to a vertical plane intersecting the test pin. Thus, by holding the pin in this manner, the test assembly avoids vibration generated during use and only provides a small indent mark on the test terminal rather than a long scratching mark or wiping. This motion also reduces pre-mature wearing of the IC terminals (e.g. contact pins) and improves their lifespan and test yield.

In one embodiment, the head receiving portion exerts a clamping force on the first resiliently biasing member to retain the test contact to the first resiliently biasing member, The head receiving portion may be at least partially circular. In an example of the test contact in use, the test contact retains the first resiliently biasing member to provide better alignment of the test contact with the corresponding IC terminal of an IC device being tested. The test contact thus minimizes its lateral movement during use and minimizes wear of the corresponding IC terminal (e.g. by scratching).

In one embodiment, the foot portion comprises a foot receiving portion arranged to receive a second resiliently biasing member. The foot receiving portion may also be at least partially circular. in the embodiment, the second resiliently biasing member biases the second electrical contacting portion against the test terminal of the test assembly during use. Also, the second resiliently biasing member decelerates force exerted on the test terminal of the test assembly by the second electrical contacting portion during use.

In one embodiment, the second electrical contacting portion comprises a profile for ratably engaging the test terminal of the test assembly during use. With this embodiment, the profile comprises a curved surface arranged such that during use rotation of the test contact effects regulation of the contact pressure between the test contact and the test terminal. Also, in an arrangement, the curved surface effects rotational movement of the test contact during use (e.g. a see-saw movement). In an example, the test contact minimizes wear from, for example, indenting the test terminals and the supporting loadboard when used. Thus, in use, force is applied on the test contact which is distributed to the first resiliently biasing member acting as a vibration dampener and force dissipater. The test contact is moved down vertically so that its second electrical contacting portion (e.g. load-board contact radius) acts as a fulcrum (e.g. contact surface pivot point) which distributes force to the second resiliently biasing member (e.g. rear elastomer). In an arrangement, the rear elastomer is also pre-tensioned and the foot receiving portion retains the rear elastomer to the test contact to minimize vibration. In this case, the second biasing member also acts as counter force generator and a force dissipater to protect the load-board against wear or damage whilst maintaining contact with the load-board. Also, the profile of the test contact enables, after force is applied to the top of the test contact, the contact surface to contact the load-board without excessive pressure by diverting away some of the force with a sliding action/motion towards the second resiliently biasing member.

The test contact may be formed of metal material, such as precious metal material, and in one arrangement, the metal material comprises NiPdAu plating. It will be appreciated by those persons skilled in the art that the material may comprise NiPd plating, Au plating, or another plating material possessing desirable properties, such as desirable hardness and durability. It will also be appreciated that the hard plating (e.g. NiPd/NiPdAu) can cause test contacts to wear prematurely under high force and vibration.

In one embodiment, the first and/or the second electrical contacting portions is/are arranged to facilitate sliding of the first and/or the second electrical contacting portion relative to the respective IC terminal or test terminal. The first and/or the second electrical contacting portion may comprise beryllium copper material.

In one arrangement, the first electrical contacting portion comprises a profile arranged to facilitate sliding of the first electrical contacting relative to the IC terminal.

In one embodiment, the foot portion comprises a thickness greater than a thickness of the head portion. With this embodiment, the thickness of the head portion may be less than the width of an IC terminal of an IC device desired to be tested. In an alternative embodiment, the head portion comprises a thickness greater than a thickness of the foot portion.

In one embodiment, the first resiliently biasing member comprises an elastomeric member, Also, the second resiliently biasing member may comprise an elastomeric member.

In accordance with a first aspect of the present invention, there is provided an electrical interconnect assembly for electrically connecting test terminals of an IC test assembly with respective IC terminals of an IC device, the electrical interconnect assembly comprising:

a first resiliently biasing member;
a plurality of test contacts as claimed in any one of the preceding claims, each of the test contacts being retained in contact with the first resiliently biasing member; and
a housing provided with a plurality of contact sockets, each contact socket being arranged to receive a test contact such that the test contact is movable during use relative to the contact socket; wherein
the first resiliently biasing member arranged to bias the respective first electrical contacting portions against the IC terminals of the IC device during use.

In one embodiment, the first and second resiliently biasing members comprise respective elongate elastomeric members, which may be substantially cylindrical. While the elastomeric members are generally cylindrical in this embodiment, it will be understood that any suitable shape is envisaged.

In an embodiment, the second resiliently biasing member prevents the test contacts from contacting the housing, in particular the corresponding contact sockets, with excessive force. Thus, in the embodiment, the second resiliently biasing member provides safety for the sockets and prevents the test contacts from over travelling their home position in their respective sockets by acting like a vertical spring loaded pin. The second biasing member also decelerates force applied to the test contacts, during testing, and pushes the test contacts back to their home position without excessive stress on the load-board to prolong load-board life and to improve test yield.

In one embodiment, each contact socket is configured such that the contact socket is keyed to the foot portion so that the amount of permitted rotation of the test contact relative to the respective contact socket is restricted. In this embodiment, the contact socket may also comprise a stop to restrict rotation of the test contact. Each contact socket and stop further improves co-planarity of the test contacts to minimize wear of the IC terminals.

BRIEF DESCRIPTION OF THE DRAWINGS

The present invention will now be described, by way of example only, with reference to the accompanying drawings, in which.

DESCRIPTION OF AN EMBODIMENT OF THE INVENTION

Figure 1:
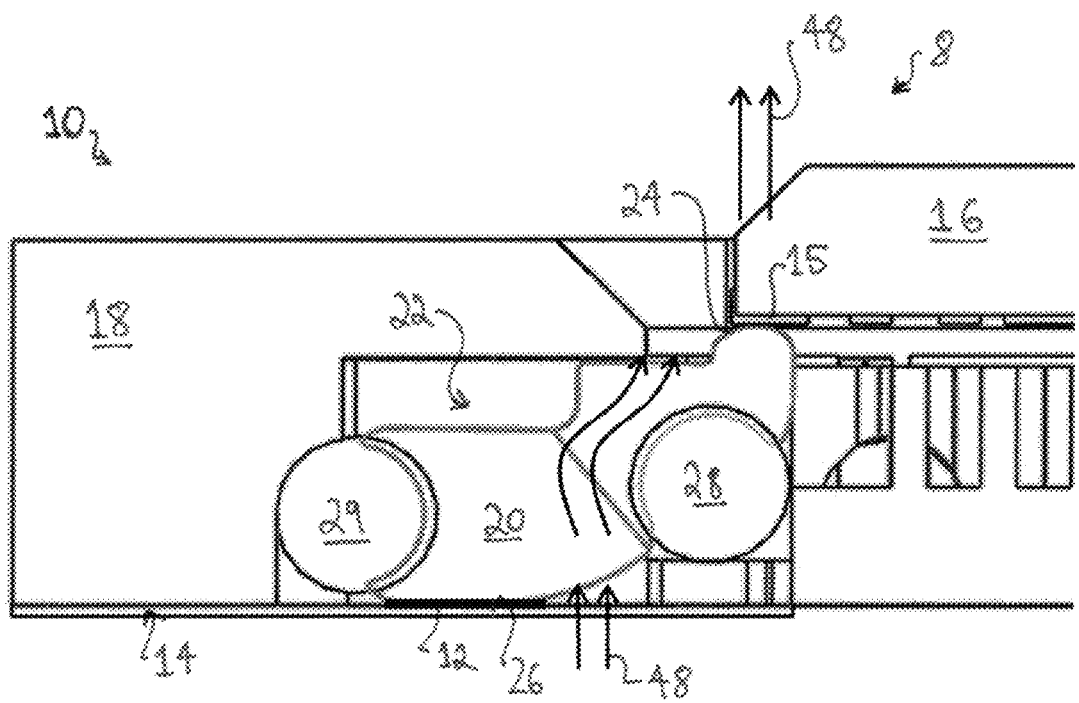
FIG. 1 is a diagrammatic cross-sectional view of a test system of the type including a test assembly and an electrical interconnect assembly in accordance with an embodiment of the present invention, and showing a test contact forming part of the interconnect assembly.

Referring to FIG. 1, a test system 8 is shown for testing IC devices. The test system 8 is of a type including an electrical interconnect assembly 10 according to an embodiment of the present invention for forming an electrical connection between test terminals 12 of a test assembly 14 and IC terminals 15 of an IC device 16 desired to be tested. The test terminals 12 are located on a load-board of the test assembly 14.

The test assembly 14 is arranged to carry out a series of tests on an IC device 16 connected to the test assembly 14 through the interconnect assembly 10, for example by applying defined signals to the test terminals 12, monitoring response signals and comparing the response signals to reference responses.

Figure 4:
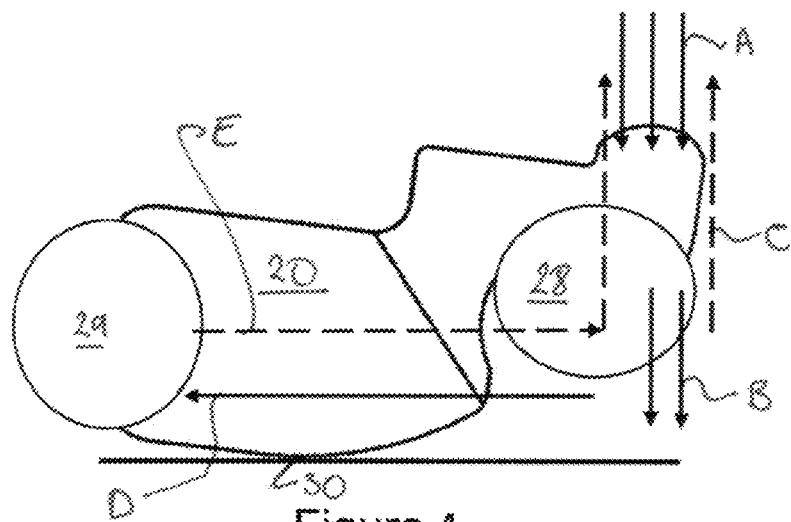
FIG. 4 is a further diagrammatic cross-sectional view of the test contact of FIG. 2.

The interconnect assembly 10 comprises a housing 18 having a plurality of test contacts 20, as shown in FIG. 4, movably disposed in respective contact sockets 22 formed in the housing 18. Each of the test contacts 20 in this example is formed of electrically conductive material, for example a NiPdAu plated material, and is formed of generally planar sheet-like material.

In the embodiment, each test contact 20 is generally L-shaped and includes a first electrical contacting portion 24 arranged to engage during use with an IC terminal 15 and a second electrical contacting portion 26 arranged to engage during use with a test terminal 12. The test contacts are arranged to engage with a first resiliently biasing member 28, in this example in the form of an elongate generally cylindrical elastomeric member, which cooperates with the test contacts 20 to urge the first electrical. Contacting portion 24 towards an. IC terminal 15, and to urge the second electrical contacting portion 26 towards a test terminal 12. The test contacts 20 are prevented from lateral and vertical movement relative to a vertical plane intersecting the test contacts 20 by retaining in contact with the first biasing member 28 with respective suitably shaped receiving portions. It can be seen in the Figures that the first biasing member 28 is mounted to the housing 18.

In addition, it will be understood that the retention by the receiving portions reduces skewing of the test contacts 20 and thereby provides better co-planarity of test contacts 20. That is, the retention prevents the contacts 20 from moving vertically and laterally relative to a vertical plane intersecting the test terminals 15 to maintain alignment with the IC terminals 15 of an IC device 16 to be tested.

It can be seen from the Figures that test contacts 20 each comprise a head portion 32 and a foot portion 34, and the head portion comprises a head receiving portion 36 which is suitably shaped to exert a clamping force on the cylindrical first resiliently biasing member 28 so that the head receiving portions 36 is retained in contact with the first resiliently biasing member 28. In particular, the receiving portion 36 is shown as being partially circular to receive the first resilient means 28. That is, the receiving portion 36 exerts a pre-tension force on the first resilient means 28 so that it can be retained.

Figure 3:
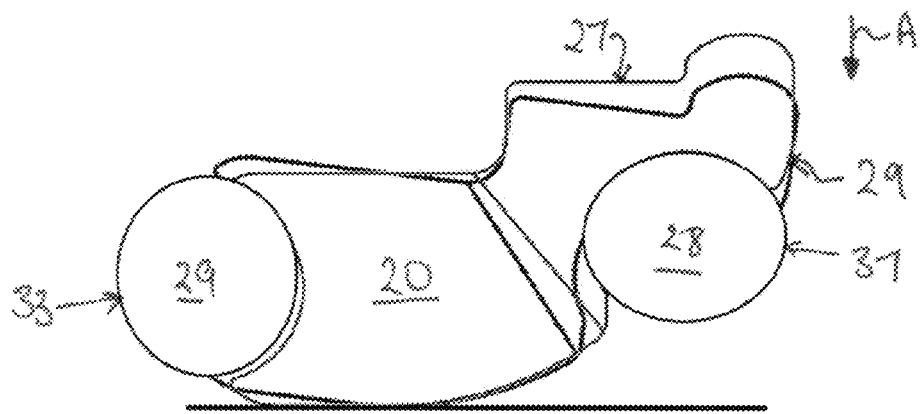
FIG. 3 is a further diagrammatic cross-sectional view of the test contact. of FIG. 2.

During use, an IC device 16 to be tested is disposed on the interconnect assembly 10 and the IC device 16 is urged towards the interconnect assembly 10, as indicated by Arrow A shown in FIG. 3, in the direction of the vertical plane interesecting the test terminal. Once in the testing position, the IC device 16 is secured in any appropriate way, for example using one or more screws. This causes establishment of good electrical contact between each first contacting portion 24 and an IC portion 15 and between each second contacting portion 26 and a test terminal 12, with each test contact 20 moving from a first position shown by line 27 in FIG. 3 in the direction of Arrow A to a second position shown by line 25 in FIG. 3. As the test contact 20 moves between the first position and the second position, a small degree of rotation occurs which causes a wiping action to occur at the IC terminals 15 and at the test terminals 12, thereby ensuring good electrical contact.

A test contact 20 in accordance with an embodiment of the present invention is shown in Figure 5A, The test contact 20 comprises a head portion 32, a foot portion 34 and a receiving portion 36, as described, with the receiving portion 36 in this embodiment of generally part-circular shape. The receiving portion 36 is configured to receive the first biasing member 28 such that during use when an IC device 16 being tested is engaged with the interconnect assembly 10 and the test contact 20 moves from the first position to the second position, the biasing member 28 is compressed and the biasing member 28 thereby exerts a biasing force on the IC terminals 15 and the test terminal 12.

Figure 2:
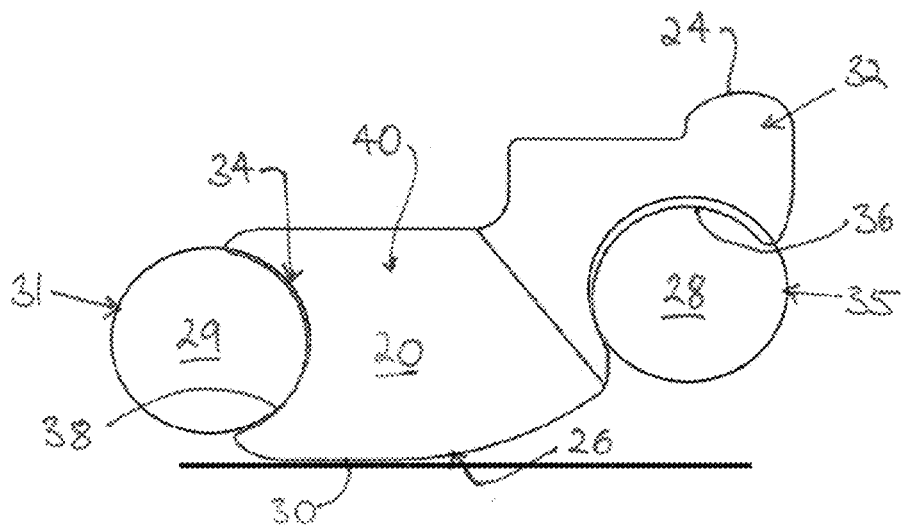
FIG. 2 is a diagrammatic cross-sectional view of a test contact forming part of the interconnect assembly of FIG. 1.

That is, during use, the IC device 16 is urged towards the interconnect assembly 10, as indicated by Arrow A of FIG. 3, and the test contact 20 is rotated to the second position shown by the line 25 in FIG. 3. The head portion 32 thus compresses the first biasing member 28 from a first. position 35 shown in FIG. 2 to a second position 37 shown in FIG. 3 and biases the test contact 20 back towards the first position. Also, the act of rotation of the test contact 20 urges the foot portion 38 towards a second resiliently biasing member 29 which dampens the rotation and biases the second electrical contacting portion 26 against the test terminal. 12 of the test assembly 10. Under rotation, the second resiliently biasing member 29 compresses from a first position 31 shown in FIG. 1 to a second position 33 shown in FIG. 3 to dampen the rotation and ensure that good electrical connection is made between the second electrical contacting portion 26 and the test terminal 12 but not so excessive so as to be detrimental to the test terminal 12. That is, the second resiliently biasing member 29 decelerates force exerted on the test terminal 12 by the second electrical contacting portion 26 during use minimize wear of the test terminal 12.

It can be seen that the second resiliently biasing member 29 is also substantially cylindrical is shape and the foot portion 34 of the test contact 20 comprises a foot receiving portion 38 arranged to receive the second resiliently biasing member 29. The foot receiving portion 38 is also part circular and, in one example, may also be arranged to exert a clamping force on the second resiliently biasing member 29, provided that the test contact 20 can still rotate and the second electrical contacting portion 26 can rotably engage the test terminal 12. The first 28 and second biasing members 29 are also fixed to the housing 18 and retained in contact with the test contact 20 by the respective clamping forces imparted by the head receiving portion 36 and the foot receiving portion 38 of the test contact 20.

In addition, the test contact 20 also includes a profile for rotably engaging the test terminal 12. The profile comprises a curved contact surface 30, part of which constitutes the second electrical contacting portion 26, such that during use the curved. contact surface 30 regulates the contact pressure on the test terminal 12 to maintain a good electrical connect but minimize wear. In addition, the curved surface 30 enables the test contact 20 to regulate the contact pressure at the second electrical contacting portion 26 by self-adjusting its orientation relative to the test terminal 12.

FIG. 4 shows the forces applied to the test contact 20 during use of the test system 8. During use, the IC device 16 is urged towards the interconnect assembly 10, as indicated by Arrows A, which imparts a force to the test contact 20 and, in turn, to the first biasing member 28 as shown by Arrow B. The first biasing member 28 acts as a dampener and provides a counter force, shown by dotted arrow C, to the test contact 20. The test contact 20 is moved down vertically with the curved contact surface 30 acting as a fulcrum to translate force to the second resiliently biasing member 29 as shown by Arrow D. The second biasing member 29 also provides a counter force, shown by dotted Arrow E, to protect the load-board from wear.

The biasing force exerted by the first electrical contacting portion 24 on an IC terminal 15 should also be sufficient to achieve good electrical contact, but not so excessive so as to be potentially detrimental to the IC terminal 15. Furthermore, in order to facilitate good sliding action with some resilience at the IC terminals 15, at least part of the test contact 20 at the first electrical contacting portion 24 may be formed of beryllium copper material. In addition, it can be seen in FIG. 5A that the first electrical contacting portion 24 comprises a radius 44 suitable for sliding against the IC terminal 15 so that the test contact 20 can be rotated into the second position.

Figure 5:
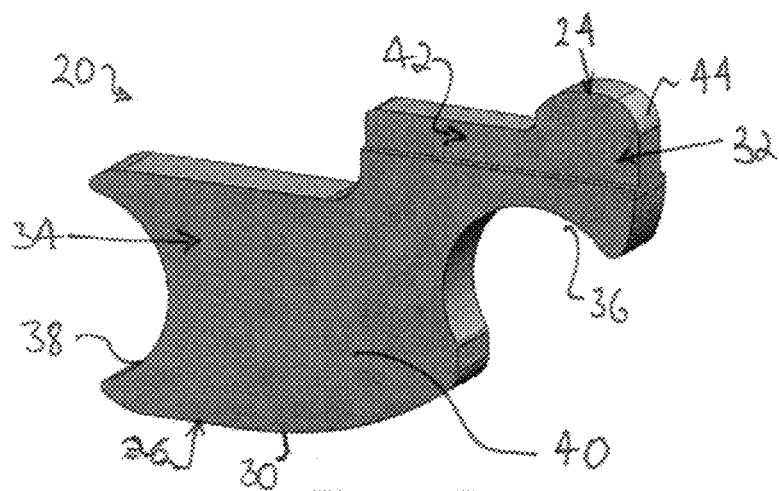
FIG. 5 is a diagrammatic perspective view of the test contact of FIG. 2.

The test contact 20 shown in FIG. 5 comprises a body portion 40 of generally constant thickness and the head portion 32 has a protruding portion 42 of generally reduced thickness relative to the body portion 40. That is, the protruding portion 42 is reduced in thickness symmetrically towards the radius 44, which is suitable for sliding against the IC terminal 15, to provide sufficient contact force with the IC terminal 15 and the test terminal 12 of the load-board whist maintaining balance of the test contact 20 under use. The symmetry of the test contact 20 enables its centre of gravity to be balanced and thus increases the lifespan of the test assembly 14. Also, the reduced thickness enables the test contact 20 to be used with finer pitch. IC devices whilst. maintaining sufficient thickness of the test contact 20 to engage a stop SO of the housing 18. It will be appreciated by those persons skilled in the art that the contact socket 22 formed in the housing 18 is configured to receive the reducing thickness test contact 20, for example with suitable thickness socket walls, to enhance durability of the electrical interconnect assembly 10.

The protruding portion 42 also includes a surface which constitutes the first electrical contacting portion 24. The test contact 20 shown in FIG. 5 is particularly suitable for use with pad/unleaded type IC devices. Pad/unleaded type IC devices require a higher contact force at the pad—test contact interface than leaded type IC devices and, as such, damage to the IC terminals 15 and/or the test terminals 12 is more likely.

Alternatively, the test contact 20 may comprise a body portion 40 of generally constant thickness and the protruding portion 42 having generally an enlarged thickness relative to the body portion 40, which is more suited to leaded type IC devices. In a further alternative, just the radius 44 of the protruding portion 42 has a greater thickness relative to the body portion 40 to form a headed pin, as shown in FIG. 5. In this case, the enlarged radius 44 of the protruding portion 42 is also symmetrical to ensure balance of the test contact 20 under use. The reduced thickness of the body portion 40 relative to the headed pin also allows for finer pitched IC devices to be tested. Also, it will be understood that by maintaining a relatively large width at the second electrical contacting portion 26, the contact pressure at the test contact—test terminal interface is maintained sufficiently low to avoid damage to the test terminals 12.

Figure 6:
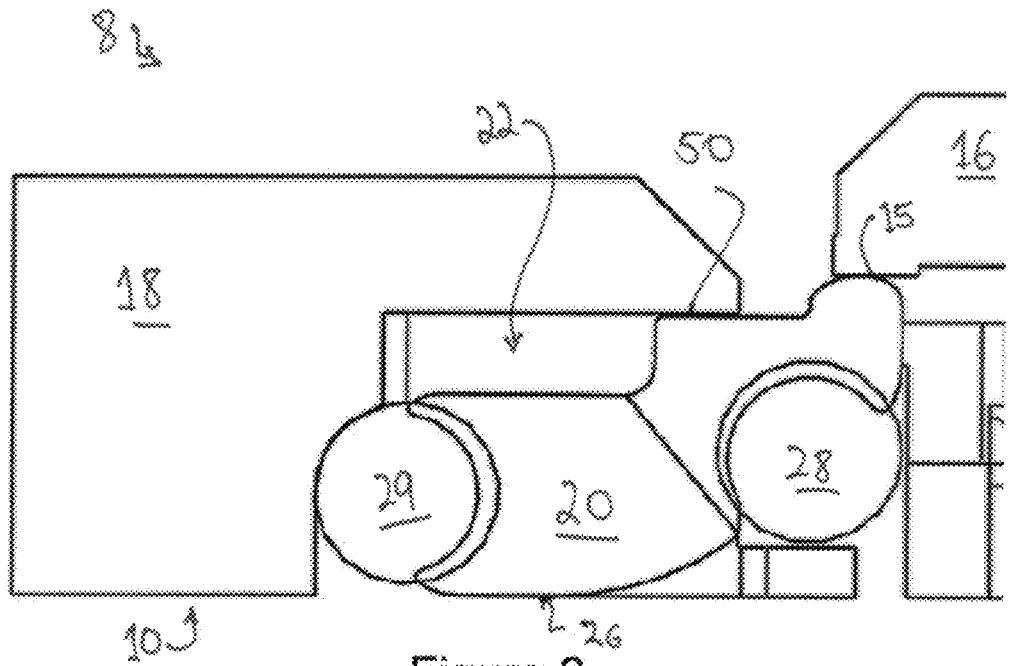
FIG. 6 is diagrammatic cross-sectional view of a test system, and showing an IC device disposed on the interconnect assembly of FIG. 1.
Figure 7:
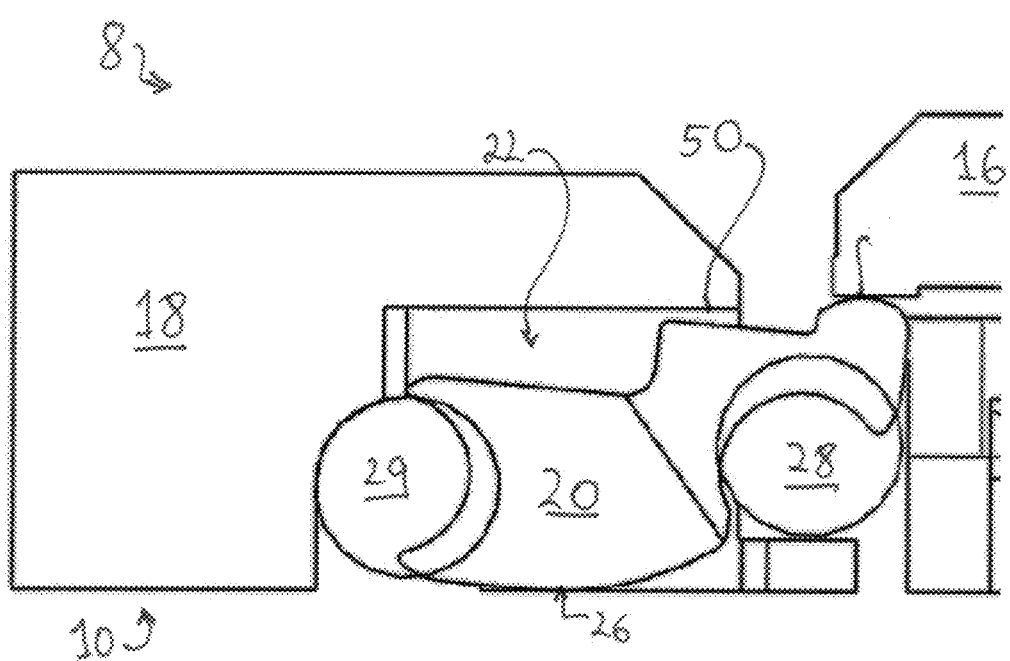
FIG. 7 is diagrammatic cross-sectional view of a test system, and showing an IC device disposed on the interconnect assembly of FIG. 1 in use.
Figure 8:
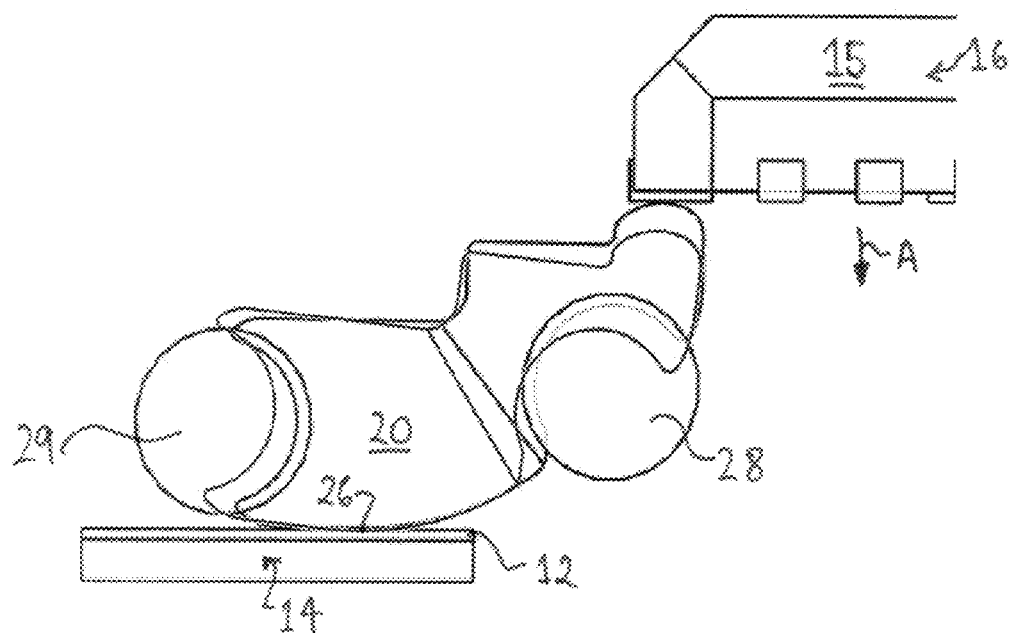
FIG. 8 is a further diagrammatic cross-sectional view of the the interconnect assembly of FIG. 1.

It can also be seen in FIGS. 6 and 7 that the contact socket 22 comprises a stop 50 to restrict rotation of the test contact 20. The stop 50 acts on the test contact 20 to restrict vertical movement of the test contact 20 relative to the vertical plane intersecting the test terminal 16, as well as frictionally restricting lateral movement, thereby further maintaining the co-planarity of the test contact 20. That is, during use of the test system 8, the IC device 16 is urged from a first position shown in FIG. 6 towards the interconnect assembly 10 to a second position shown in FIG. 7 which acts to rotate the test contact 20 within the socket 22 to form an electrical connection between the test terminals 12 and the IC terminals 15 of the IC device 16. This can be seen more clearly in FIG. 8 where the IC device 16 is moved in the direction of Arrow A.

Figure 9:
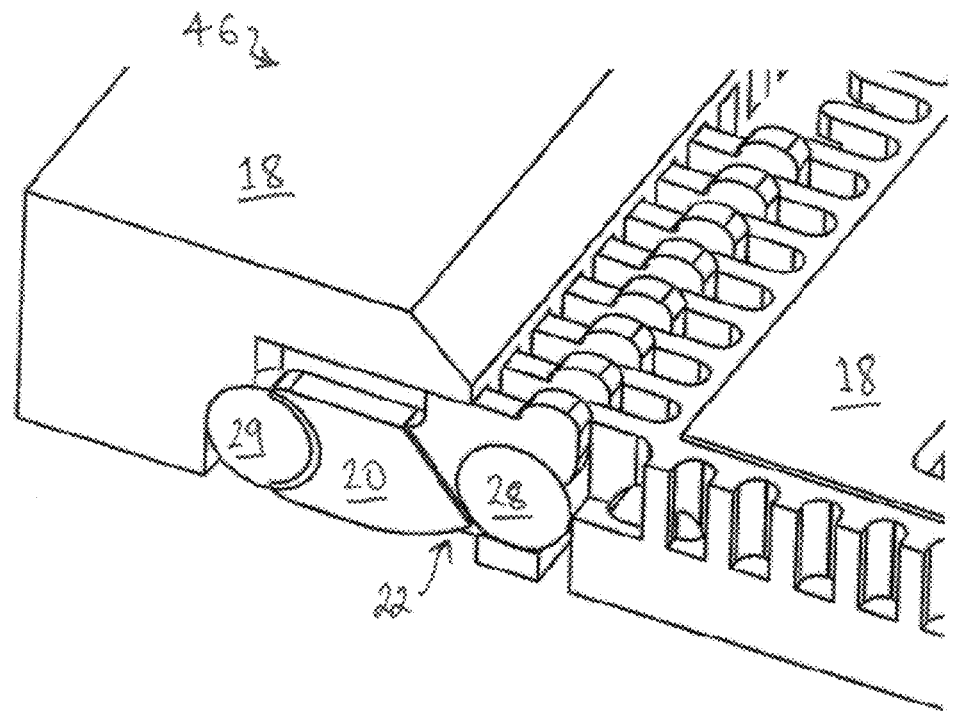
FIG. 9 is a diagrammatic perspective view of an interconnect assembly in accordance with an embodiment of the invention, and showing a plurality of test contacts of the type shown in FIG. 2.

FIG. 9 shows a test system 46 according to an embodiment of the present invention showing a plurality of the above described test contacts 20 in their respective contact sockets 22. In this system 46, each test contact 20 is configured in their respective contact socket 22 and each contact socket 22 is keyed to the corresponding foot portion 34 so that the amount of permitted rotation of each test contact 20 relative to the respective contact socket 22 is restricted. Furthermore, the arrangement of the contact socket 22 allows for air flow (shown by arrows 48 in FIG. 1) to cool the IC device 16 and the electrical interconnect assembly 10 during use.

Modifications and variations as would be apparent to a skilled addressee are deemed to be within the scope of the present invention.

We claim:

1. An electrical test contact for electrically connecting a test terminal of an IC test assembly with an IC terminal of an IC device in an electrical interconnect assembly, comprising:
   a first electrical contacting portion for electrically engaging said IC terminal of an IC device during use;
   a second electrical contacting portion fixed to said first electrical contacting portion for electrically engaging said test terminal of a test assembly during use, said second electrical contacting portion having a curved surface for rotably engaging said test terminal during use;
   a first resiliently biasing member adapted to engage with said first electrical contacting portion; and
   a second resiliently biasing member adapted to engage with said second electrical contacting portion and to decelerate a force exerted on the test terminal of the test assembly by the second electrical contacting portion during use.

2. An electrical test contact for electrically connecting a test terminal of an IC test assembly with an IC terminal of an IC device in an electrical interconnect assembly according to claim 1, wherein said first resiliently biasing member has an elongated cylindrical shape.

3. An electrical test contact for electrically connecting a test terminal of an IC test assembly with an IC terminal of an IC device in an electrical interconnect assembly according to claim 1, wherein the arrangement of the first and second electrical contacting portions and the first and second resiliently biasing members is such that, during use, when the first electrical contacting portion is pushed downwards, said second electrical contacting portion acts as a pivot along its said curved surface.

4. An electrical test contact for electrically connecting a test terminal of an IC test assembly with an IC terminal of an IC device in an electrical interconnect assembly according to claim 1, wherein said second resiliently biasing member is adapted to prevent said test contact from contacting said housing.

5. An electrical test contact for electrically connecting a test terminal of an IC test assembly with an IC terminal of an IC device in an electrical interconnect assembly according to claim 1, wherein said second resiliently biasing member has an elongated cylindrical shape.

6. An electrical test contact for electrically connecting a test terminal of an IC test assembly with an IC terminal of an IC device in an electrical interconnect assembly according to claim 1, wherein said first and second electrical contacting portions are formed of electrically conductive material.

7. An electrical test contact for electrically connecting a test terminal of an IC test assembly with an IC terminal of an IC device in an electrical interconnect assembly according to claim 1, wherein said first and second electrical contacting portions are formed of metal.

8. An electrical test contact for electrically connecting a test terminal of an IC test assembly with an IC terminal of an IC device in an electrical interconnect assembly according to claim 7, wherein said metal comprises NiPdAu plating.

9. An electrical test contact for electrically connecting a test terminal of an IC test assembly with an IC terminal of an IC device in an electrical interconnect assembly according to claim 1, wherein said first and second resiliently biasing members are formed of an elastomeric material.

10. An electrical test contact for electrically connecting a test terminal of an IC test assembly with an IC terminal of an IC device in an electrical interconnect assembly according to claim 1, wherein there is a sliding action between said second electrical contacting portion and said test terminal during use.

\* \* \* \* \*